(12) United States Patent
Lin et al.

(10) Patent No.: US 8,211,267 B2
(45) Date of Patent: *Jul. 3, 2012

(54) ELECTROMAGNETIC SHIELDING COMPOSITE AND METHOD FOR MAKING THE SAME

(75) Inventors: Cheng-Hsien Lin, Tu-Cheng (TW); Yao-Wen Bai, Bei-Jing (CN); Wen-Chin Lee, Tu-Cheng (TW); Rui Zhang, Bei-Jing (CN); Kai-Li Jiang, Bei-Jing (CN); Chen Feng, Bei-Jing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 956 days.

This patent is subject to a terminal disclaimer.

(21) Appl. No.: 12/156,818

(22) Filed: Jun. 5, 2008

(65) Prior Publication Data
US 2009/0092813 A1    Apr. 9, 2009

(30) Foreign Application Priority Data
Oct. 5, 2007    (TW) .............................. 96137493 A

(51) Int. Cl.
*B32B 5/08*    (2006.01)
*B32B 5/12*    (2006.01)
*B32B 5/18*    (2006.01)

(52) U.S. Cl. ...................................... 156/296; 977/789

(58) Field of Classification Search ................... 156/296; 977/789, 796
See application file for complete search history.

(56) References Cited

U.S. PATENT DOCUMENTS

| | | | |
|---|---|---|---|
| 7,393,428 B2 * | 7/2008 | Huang et al. ................... 156/249 |
| 2003/0077515 A1 | 4/2003 | Chen et al. |
| 2003/0122111 A1 | 7/2003 | Glatkowski |
| 2003/0133865 A1 * | 7/2003 | Smalley et al. ............. 423/447.1 |
| 2004/0047038 A1 * | 3/2004 | Jiang et al. ..................... 359/486 |
| 2005/0116336 A1 | 6/2005 | Chopra et al. |
| 2005/0266162 A1 | 12/2005 | Luo et al. |
| 2007/0166223 A1 * | 7/2007 | Jiang et al. .................. 423/447.1 |
| 2009/0311166 A1 * | 12/2009 | Hart et al. ................. 423/445 B |

FOREIGN PATENT DOCUMENTS

| CN | 1837146 A | * | 9/2006 |
|---|---|---|---|
| TW | 200724486 | | 7/2007 |

* cited by examiner

Primary Examiner — Katarzyna Wyrozebski Lee
Assistant Examiner — Scott W Dodds
(74) *Attorney, Agent, or Firm* — Altis Law Group, Inc.

(57) ABSTRACT

An electromagnetic shielding composite includes a polymer and a plurality of carbon nanotubes disposed in the polymer in a form of carbon nanotube film structure. A method for making an electromagnetic shielding composite includes the steps of: (a) providing an array of carbon nanotubes; (b) drawing a carbon nanotube film from the array of carbon nanotubes; (c) providing a substrate, covering at least one carbon nanotube film on the substrate to form a carbon nanotube film structure; and (d) providing a polymer and combining the carbon nanotube film structure with the polymer to form an electromagnetic shielding composite.

14 Claims, 3 Drawing Sheets

ELECTROMAGNETIC SHIELDING COMPOSITE AND METHOD FOR MAKING THE SAME

BACKGROUND

1. Field of the Invention

The present invention relates to an electromagnetic shielding composite and method for making the same.

2. Discussion of Related Art

With the development of information technology, the harmful effects of electromagnetic interference, electromagnetic leakage, and electromagnetic radiation has attracted a lot of attention. And now, metal materials with good conductivity, such as copper and silver, are widely used as electromagnetic shielding materials. However, the metal materials have some disadvantages, such as high cost, high density, easy to oxidize and erode.

Carbon nanotubes (CNTs) are a novel carbonaceous material and have received a great deal of interest since the early 1990s. CNTs have a large ratio of length/diameter (being always more than 1000). This special structure ensures they have excellent electrical and mechanical properties, such as better conductivity than copper among other things. Due to these properties, CNTs have become an important new material for use in electromagnetic shielding.

Nowadays, the method for using CNTs in electromagnetic shielding is by dispersing the CNTs in polymer to form a composite. But due to their small diameter and large surface energy, the CNTs are easy to agglomerate. A process of surface modification is used to avoid agglomeration. However, this process of surface modification has the following disadvantages among others: firstly, the process results in defects of the walls of the CNTs, such as decreasing the length/diameter ratio, which negatively impacts conductivity and other properties thereof, and thereby affects the property of electromagnetic shielding; secondly, this method is only suitable for combining CNTs with just a few types of polymers, which restricts the scope of applications; and thirdly, the method of surface modification is expensive.

What is needed, therefore, is an electromagnetic shielding composite and method for making the same, with good electromagnetic shielding properties, and the method for making the electromagnetic shielding composite is simple and without need of a surface pre-treatment for the CNTs.

SUMMARY

In one embodiment, a method for making an electromagnetic shielding composite includes the steps of: (a) providing an array of carbon nanotubes; (b) drawing a carbon nanotube film from the array of carbon nanotubes; (c) providing a substrate, covering at least one carbon nanotube film on the substrate to form a carbon nanotube film structure; and (d) providing a polymer and combining the carbon nanotube film structure with the polymer to form an electromagnetic shielding composite.

Other advantages and novel features of the present electromagnetic shielding composite and method for making the same will become more apparent from the following detailed description of preferred embodiments when taken in conjunction with the accompanying drawings.

BRIEF DESCRIPTION OF THE DRAWINGS

Many aspects of the present electromagnetic shielding composite and method for making the same can be better understood with reference to the following drawings. The components in the drawings are not necessarily to scale, the emphasis instead being placed upon clearly illustrating the principles of the present electromagnetic shielding composite and method for making the same.

Figure 1:
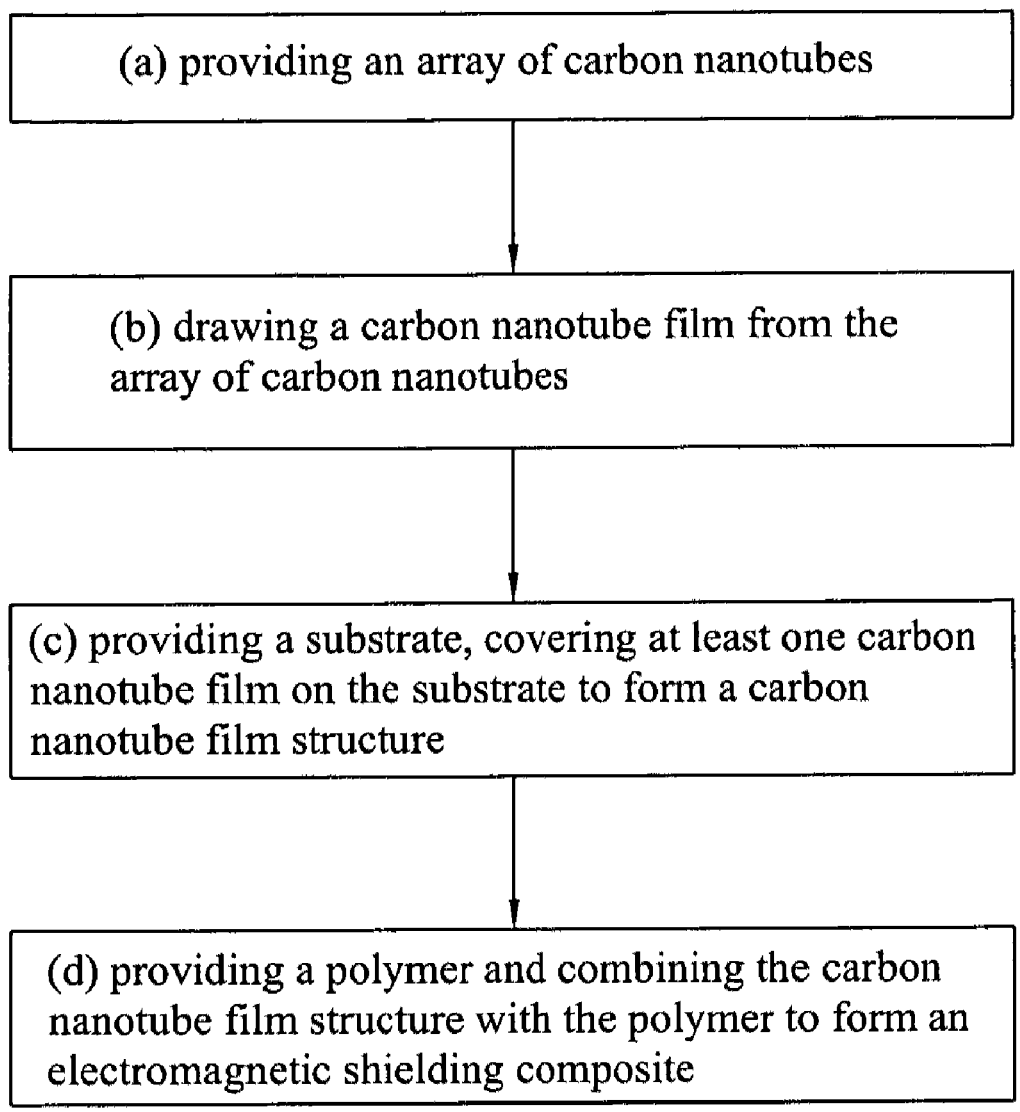
FIG. 1 is a flow chart of a method for making an electromagnetic shielding composite, in accordance with a present embodiment.

Corresponding reference characters indicate corresponding parts throughout the several views. The exemplifications set out herein illustrate at least one preferred embodiment of the present electromagnetic shielding composite and method for making the same, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present electromagnetic shielding composite and method for making the same.

Referring to FIG. 1, a method for making an electromagnetic shielding composite includes the steps of: (a) providing an array of carbon nanotubes, quite suitably, providing a super-aligned array of carbon nanotubes; (b) drawing a carbon nanotube film from the array of carbon nanotubes; (c) providing a substrate, covering at least one of the carbon nanotube film on the substrate to form a carbon nanotube film structure; and (d) providing a polymer and combining the above-describe carbon nanotube film structure with the polymer to form an electromagnetic shielding composite.

In step (a), a given super-aligned array of carbon nanotubes can be formed by the steps of: (a1) providing a substantially flat and smooth substrate; (a2) forming a catalyst layer on the substrate; (a3) annealing the substrate with the catalyst layer thereon in air at a temperature in an approximate range from 700° C. to 900° C. for about 30 to 90 minutes; (a4) heating the substrate with the catalyst layer thereon at a temperature in an approximate range from 500° C. to 740° C. in a furnace with a protective gas therein; and (a5) supplying a carbon source gas to the furnace for about 5 to 30 minutes and growing a super-aligned array of carbon nanotubes on the substrate.

In step (a1), the substrate can be a P-type silicon wafer, an N-type silicon wafer, or a silicon wafer with a film of silicon dioxide thereon. Preferably, a 4 inch P-type silicon wafer is used as the substrate. In step (a2), the catalyst can, advantageously, be made of iron (Fe), cobalt (Co), nickel (Ni), or any alloy thereof.

In step (a4), the protective gas can, beneficially, be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The super-aligned array of carbon nanotubes can, opportunely, have a height of about 200 to 400 microns and includes a plurality of carbon nanotubes parallel to each other and approximately perpendicular to the substrate. The super-aligned array of carbon nanotubes formed under the above conditions is essentially free of impurities, such as carbonaceous or residual catalyst particles. The carbon nanotubes in the super-aligned array are closely packed together by the van der Waals attractive force.

Step (b) further includes the substeps of: (b1) selecting a plurality of carbon nanotube segments having a predetermined width from the array of carbon nanotubes; (b2) pulling the carbon nanotube segments at an even/uniform speed to form the carbon nanotube film.

In step (b1), quite usefully, the carbon nanotube segments having a predetermined width can be selected by using an adhesive tape as a tool to contact with the super-aligned array. In step (b2), the pulling direction is, usefully, substantially perpendicular to the growing direction of the super-aligned array of carbon nanotubes.

More specifically, during the pulling process, as the initial carbon nanotube segments are drawn out, other carbon nanotube segments are also drawn out end to end, due to the van der Waals attractive force between ends of adjacent segments. The carbon nanotube film produced in such manner can be selectively formed having a predetermined width. The carbon nanotube film includes a plurality of carbon nanotube segments. The carbon nanotubes in the carbon nanotube film are mainly parallel to the pulling direction of the carbon nanotube film.

A width of the carbon nanotube film depends on a size of the carbon nanotube array. A length of the carbon nanotube film can arbitrarily be set as desired. In one useful embodiment, when the substrate is a 4-inch type wafer as in the present embodiment, a width of the carbon nanotube film is in an approximate range from 1 centimeter to 10 centimeters. A thickness of the carbon nanotube film is in an approximate range from 0.01 micrometer to 100 micrometers.

In step (c), the substrate can be any kind of substrate necessary to form an electromagnetic shielding material on a surface thereof. In the present embodiment, the substrate is a quadrate plastic substrate. It can be understood that the size of the substrate can be arbitrarily set according to the actual application. When the width of the substrate is larger than that of the carbon nanotube film, a plurality of carbon nanotube films can be covered on the surface of the substrate side by side.

It is noted that because the carbon nanotubes in the super-aligned carbon nanotube array have a high purity and a high specific surface area, the carbon nanotube film is adhesive. As such, the carbon nanotube film can adhere to the surface of the substrate directly. A plurality of carbon nanotube films can adhere to each surface one after another to form a multi-layer carbon nanotube film structure. The number of the layers and the angle between the aligned directions of two adjacent layers are arbitrary and depends on the actual needs/use. The aligned directions of the two adjacent layers form an angle $\alpha$, and the angle $\alpha$ is in an approximate range of $0° \leq \alpha \leq 90°$. The adjacent layers of the carbon nanotube film are combined by van de Waals attractive force to form a stable multi-layer film.

It can be understood that alternatively, the substrate can be a frame structure. The carbon nanotube film can adhered, directly, to the surface of the frame structure and fixed via the periphery of the carbon nanotube film.

Quite usefully, when the carbon nanotube film structure is formed, by a plurality of carbon nanotube films, the carbon nanotube films cross and overlap each other. In another step, the carbon nanotube film structure is treated with an organic solvent. The organic solvent is volatilizable and can be selected from the group consisting of ethanol, methanol, acetone, dichloroethane, chloroform, and combinations thereof. In the present embodiment, the organic solvent is ethanol in the present embodiment. The carbon nanotube film structure can be treated by either of two methods: dropping the organic solvent from a dropper to soak the entire surface of a side of the carbon nanotube film structure or immersing a frame with the carbon nanotube film structure thereon in a container having an organic solvent therein. After being soaked by the organic solvent, the carbon nanotube segments in the carbon nanotube film can at least partially shrinks into carbon nanotube bundles due to the surface tension created by the organic solvent. Due to the decrease of the specific surface area via bundling, the coefficient of friction of the carbon nanotube film is reduced, but the carbon nanotube film maintains high mechanical strength and toughness. Further, due to the shrinking of the carbon nanotube segments into carbon nanotube bundles, the parallel carbon nanotube bundles are, relatively, far apart (especially compared to the initial layout of the carbon nanotube segments) from each other in one layer and at an angle compared with the parallel carbon nanotube bundles in adjacent layers. As such, a carbon nanotube film having a microporous structure can thus be formed (i.e., the micropores are defined by the spaces/gaps between adjacent bundles). The resulting spaces/gaps of the microporous structure can, beneficially, be in a range of about 100-500 mesh. It is to be understood that the microporous structure is related to the number of the layers of the carbon nanotube films in the carbon nanotube film structure. The greater the number of layers that are formed in the carbon nanotube film structure, the greater the number of bundles in the carbon nanotube film structure there will be. Accordingly, the spacing/gaps between adjacent bundles and the diameter of the micropores will decrease. Further, a carbon nanotube film structure of arbitrary width and length can be formed by layers of carbon nanotube films partially crossed and overlapped with each other. The width and length of the carbon nanotube film structure are not confined by the width and the length of the carbon nanotube film pulled from the array of carbon nanotubes.

Figure 2:
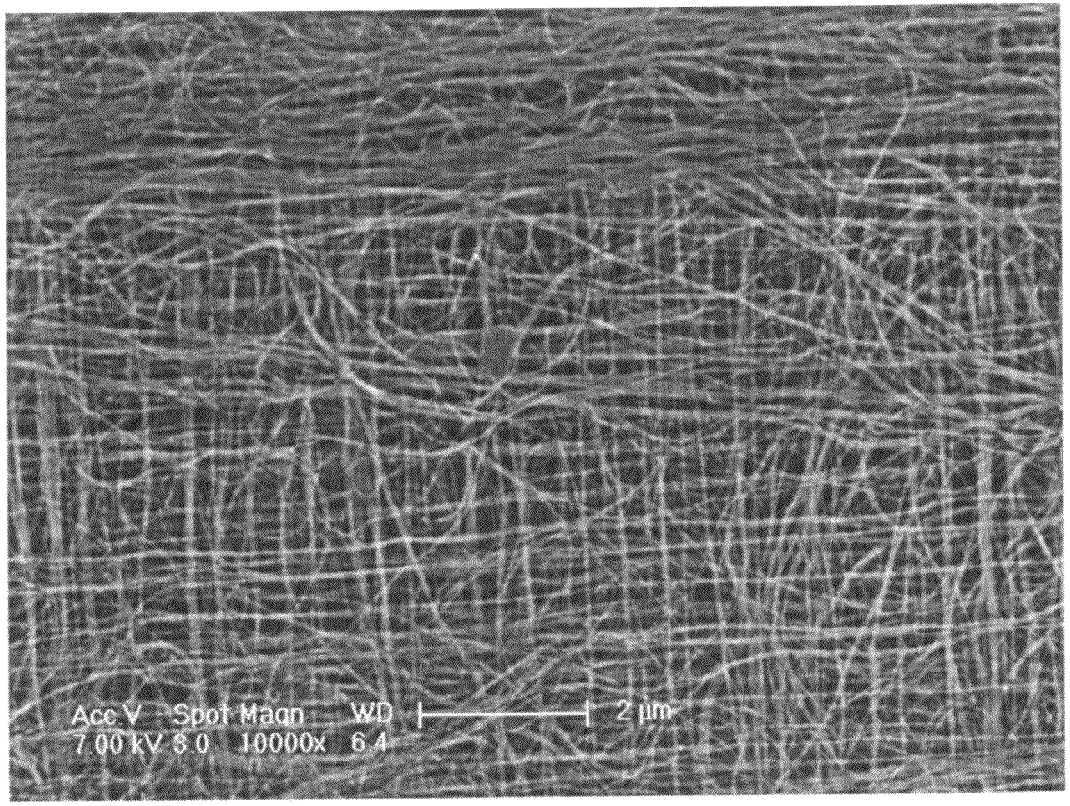
FIG. 2 shows a Scanning Electron Microscope (SEM) image of a carbon nanotube film structure for the electromagnetic shielding composite, in accordance with another present embodiment.

Referring to FIG. 2, a carbon nanotube film structure is acquired according to the present embodiment. The carbon nanotube film structure has 24 layers of carbon nanotube films crossed and overlapped with each other. The carbon nanotube segments in each layer of carbon nanotube film are aligned and connected end to end, and the alignment of two adjacent layers is different by 90°. Furthermore, the carbon nanotube film structure is treated with ethanol. After being soaked by ethanol, the carbon nanotube segments in the carbon nanotube film can at least partially compact/shrink into carbon nanotube bundles due to the surface tension created by ethanol. Then the parallel carbon nanotube bundles are, relatively, far apart (especially compared to the initial layout of the carbon nanotube segments) from each other in one layer and at angle compared with the parallel carbon nanotube bundles in adjacent layers. As such, a carbon nanotube film having a microporous structure can thus be formed. A diameter of the micropores in the microporous structure is in an approximate range from 1 nanometer to 0.5 micrometer. After step (c), a step of removing extra portions of the carbon nanotube film on edges of the substrate is further provided.

In step (d), the polymer can be a solid polymer or a polymer solution formed by a polymer dissolved in a volatile organic solvent. The solid polymer can be rubber or plastic. The polymer solution can be epoxy polymer solution or polypropylene solution.

When the polymer solution is combined with the carbon nanotube film structure, step (d) further includes the following steps of: (d1) dipping the carbon nanotube film structure prepared by the aforementioned method, directly, in a container with the polymer solution therein for some time in an approximate range from 1 hour to 12 hours to make the polymer combine with the carbon nanotube film structure; (d2) taking the carbon nanotube film structure out, and drying the carbon nanotube film structure at a certain temperature to remove the volatilizable organic solvent to acquire an electromagnetic shielding composite. The aforementioned drying temperature is in an approximate range from 80° C. to 120° C.

When the solid polymer is combined with the carbon nanotube film structure, step (d) further includes the following steps of: (d3) covering the solid polymer on the carbon nanotube film structure; and (d4) heating the solid polymer and the carbon nanotube film structure, under a certain pressure, to a certain temperature to make the solid polymer combined with the carbon nanotube film structure; (d5) cooling the solid polymer and the carbon nanotube film structure to acquire an electromagnetic shielding composite. The heating temperature can be higher than a glass transition temperature of the polymer for 20-50° C. and lower than the decomposition temperature of the polymer, and the polymer is liquid and can flows at that temperature. The aforementioned pressure can be in an approximate range from 3 atmospheres to 10 atmospheres.

It can be understood that a substrate necessary to make an electromagnetic shielding composite is chosen, then a carbon nanotube film structure is formed on the substrate, the substrate and the carbon nanotube film structure are dipped in a polymer solution for some time or a polymer is covered on the carbon nanotube film structure, the polymer and the carbon nanotube film structure are heated, under a certain pressure, to a certain temperature to combine the polymer with the carbon nanotube film structure; or the substrate with the CNT film structure is removed via dissolving or stripping, then the carbon nanotube film structure is dipped in a polymer solution for some time or the carbon nanotube structure is disposed between two layers of solid polymer, and finally, heating the polymer and the carbon nanotube film structure, under a certain pressure, to a certain temperature to make the combination thereof.

In the present embodiment, the carbon nanotube film structure and the substrate are stripped after the treatment of the substrate with the carbon nanotube film structure formed thereon by ethanol. Then the carbon nanotube film structure is dipped in an ethanol solution with epoxy polymer therein for 5 hours. Finally, the carbon nanotube film structure is taken out, and dried in a temperature of 80° C. to acquire an electromagnetic shielding composite.

Figure 3:
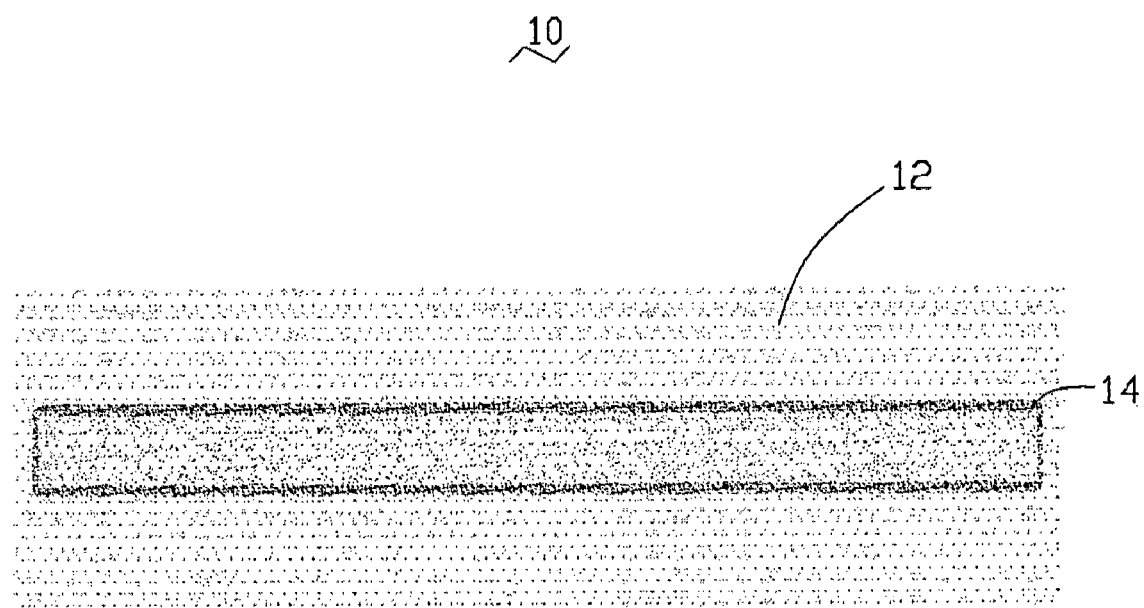
FIG. 3 is a structural schematic of an electromagnetic shielding composite using the carbon nanotube film structure of FIG. 2 and made according to the method of FIG. 1.

Referring to FIG. 3, an electromagnetic shielding composite 10 prepared by the aforementioned method is shown. The electromagnetic shielding composite 10 includes a polymer 14 and a plurality of CNTs, and the CNTs are distributed in the polymer 14 in a form of a carbon nanotube film structure 12. The carbon nanotube film structure 12 can be a layer of carbon nanotube film or multiple layers of carbon nanotube film. When the carbon nanotube film structure 12 is a single layer of carbon nanotube film, the carbon nanotube film structure 12 is a carbon nanotube film with a certain width formed by a plurality of carbon nanotube bundles aligned in a same direction and connected end to end. When the carbon nanotube film structure 12 has multiple layers of carbon nanotube film, the a plurality of carbon nanotube films can be overlapped with each other and the angle between the aligned directions of two adjacent layers may be arbitrarily set as desired. The angle α between the aligned directions of two adjacent layers is in an approximate range from 0° to 90°. The carbon nanotube film includes a plurality of carbon nanotube bundles in a preferred orientation. Carbon nanotubes bundles in two adjacent layers are crossed with each other to form a microporous structure. A diameter of the micropores is in an approximate range from 1 nanometer to 0.5 micrometer. The polymer 14 is covered on the carbon nanotube film structure 12 or filled into the micropores of the carbon nanotube film structure 12.

Compared to the conventional electromagnetic shielding composite and method for making the same, the electromagnetic shielding composite and method for making the same according to the present embodiments have the following virtues: firstly, the electromagnetic shielding composite is prepared via the carbon nanotube film structure being combined with the polymer and thus avoiding the problem of dispersing the carbon nanotubes in the polymer; secondly, the surfaces of the carbon nanotubes in the electromagnetic shielding composite are not treated with a process of surface modification and the method for making the electromagnetic shielding composite is low cost, simple, and environmentally safe; and thirdly, the content of CNTs in the electromagnetic shielding composite is not limited and many different polymers can be chosen to combine with the carbon nanotube film structure, and finally an electromagnetic shielding composite with excellent electromagnetic shielding property and other properties can be acquired.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for making an electromagnetic shielding composite, the method comprising the steps of:
   (a) providing an array of carbon nanotubes, a substrate, and a polymer;
   (b) drawing a carbon nanotube film from the array of carbon nanotubes, the carbon nanotube film comprising a plurality of carbon nanotubes joined end to end by van der Waals attractive forces;
   (c) covering at least one carbon nanotube film on the substrate to form a carbon nanotube film structure, extending directions of the carbon nanotubes in the carbon nanotube film structure are parallel with the substrate; and
   (d) combining the carbon nanotube film structure with the polymer to form an electromagnetic shielding composite.

2. The method as claimed in claim 1, wherein the polymer is a solid polymer, and the step of combining is executed by covering the solid polymer on the carbon nanotube film structure and heating the solid polymer and the carbon nanotube film structure under a certain pressure to a certain temperature, to combine the solid polymer with the carbon nanotube film structure to form the electromagnetic shielding composite, wherein the certain temperature makes the solid polymer change into a flowing liquid.

3. The method as claimed in claim 1, wherein the polymer is a polymer solution comprising the polymer dissolved in a volatile organic solvent, and the step of combining is executed by dipping the carbon nanotube film structure directly into a container with the polymer solution therein to combine the polymer in the polymer solution with the carbon nanotube film structure, after that, taking the carbon nanotube film structure out and drying the carbon nanotube film structure at a certain temperature to remove the volatile organic solvent to form the electromagnetic shielding composite.

4. The method as claimed in claim 1, wherein step (c) further comprises a step of separating the substrate from the carbon nanotube film structure via dissolving or stripping.

5. The method as claimed in claim 1, wherein a plurality of the carbon nanotube films overlap to form the carbon nanotube film structure, and the carbon nanotube film structure adheres to the substrate.

6. The method as claimed in claim 5, wherein after the formation of the carbon nanotube film structure on the substrate, a process of treating the carbon nanotube film structure with an organic solvent to form a plurality of micropores is further provided.

7. The method as claimed in claim 6, wherein the organic solvent is selected from the group consisting of ethanol, methanol, acetone, dichloroethane, and chloroform.

8. The method as claimed in claim 2, wherein the pressure is in a range from about 3 atmospheres to about 10 atmospheres.

9. The method as claimed in claim 2, wherein the temperature is higher than a glass transition temperature of the polymer by 20-50° C. and lower than the decomposition temperature of the polymer.

10. The method as claimed in claim 1, wherein the carbon nanotubes in the carbon nanotube film structure are parallel with each other.

11. A method for making an electromagnetic shielding composite, the method comprising the steps of:
    (a) providing an array of carbon nanotubes, a substrate, and a polymer;
    (b) drawing a carbon nanotube film from the array of carbon nanotubes;
    (c) repeating the step (b) to fabricate a plurality of carbon nanotube films;
    (d) crossing and overlapping the plurality of carbon nanotube films with each other to form a carbon nanotube film structure on the substrate;
    (e) forming a plurality of micropores in the carbon nanotube structure by using an organic solvent; and
    (f) combining the carbon nanotube film structure with the polymer to form an electromagnetic shielding composite.

12. The method as claimed in claim 11, wherein the polymer is a solid polymer, and the step of combining is executed by covering the solid polymer on a surface of the carbon nanotube film structure and heating the solid polymer and the carbon nanotube film structure under a certain pressure to a certain temperature, to combine the solid polymer with the carbon nanotube film structure and form the electromagnetic shielding composite.

13. The method as claimed in claim 11, wherein the polymer is a polymer solution comprising the polymer dissolved in a volatile organic solvent, and the step of combining is executed by dipping the carbon nanotube film structure directly into a container with the polymer solution therein to combine the polymer in the polymer solution with the carbon nanotube film structure, and then removing the carbon nanotube film structure from the polymer solution and drying the carbon nanotube film structure at a certain temperature to remove the volatile organic solvent and form the electromagnetic shielding composite.

14. The method as claimed in claim 11, wherein an angle between adjacent carbon nanotube films in the carbon nanotube film structure is in a range from about 0° to about 90°.

* * * * *